(12) United States Patent
Chen et al.

(10) Patent No.: US 8,258,584 B2
(45) Date of Patent: Sep. 4, 2012

(54) OFFSET GATE SEMICONDUCTOR DEVICE

(75) Inventors: Chun-Hung Chen, Jhubei (TW);
Lee-Wee Teo, Singapore (SG); Ming Zhu, Singapore (SG); Bao-Ru Young, Zhubei (TW); Harry Hak-Lay Chuang, Hsinchu (TW)

(73) Assignee: Taiwan Semiconductor Manufacturing, Inc., Hsin-Chu (TW)

( * ) Notice: Subject to any disclaimer, the term of this patent is extended or adjusted under 35 U.S.C. 154(b) by 216 days.

(21) Appl. No.: 12/846,457

(22) Filed: Jul. 29, 2010

(65) Prior Publication Data
US 2012/0025309 A1 Feb. 2, 2012

(51) Int. Cl.
*H01L 29/76* (2006.01)
*H01L 29/94* (2006.01)

(52) U.S. Cl. ... 257/396; 257/397; 257/412; 257/E27.06; 438/294; 438/296

(58) Field of Classification Search .............. 257/396, 257/397, 412, E27.06; 438/294, 296
See application file for complete search history.

(56) References Cited

U.S. PATENT DOCUMENTS

| 2009/0108352 A1* | 4/2009 | Majumdar et al. ............ 257/347 |
| 2009/0140261 A1* | 6/2009 | Saeki .............................. 257/72 |

* cited by examiner

*Primary Examiner* — Ngan Ngo
(74) *Attorney, Agent, or Firm* — Haynes and Boone, LLP (57) ABSTRACT

An offset gate semiconductor device includes a substrate and an isolation feature formed in the substrate. An active region is formed in the substrate substantially adjacent to the isolation feature. An interface layer is formed on the substrate over the isolation feature and the active region. A polysilicon layer is formed on the interface layer over the isolation feature and the active region. A trench being formed in the polysilicon layer over the isolation feature. The trench extending to the interface layer. A fill layer is formed to line the trench and a metal gate formed in the trench.

20 Claims, 10 Drawing Sheets

OFFSET GATE SEMICONDUCTOR DEVICE

BACKGROUND

The present disclosure relates generally to semiconductor technology, and more particularly, to a semiconductor device having an offset gate, and a method of fabricating the same.

High voltage metal-oxide-semiconductor (HVMOS) devices have many applications including CPU power supplies, power management systems, AC/DC converters and the like. As semiconductor circuits composed of devices such as metal-oxide-semiconductor field effect transistors (MOSFETs) are adapted for high voltage applications, problems arise with respect to their reliability. For example, a high gate current can degrade the devices reliability. Methods of reducing the gate current injected such as reducing the drift region doping and modifying device dimensions can lead to other issues such as increasing the turn-on resistance of the device. HVMOS devises are important for many types of technology. With the incorporation of high k metal gate (HKMG) devices, particularly, replacement polysilicon gate (RPG) it is still important to be able to form HVMOS devices that have good reliability and can withstand high voltages at the gate of the device. However, it is difficult to fabricate HVMOS devices using traditional RPG processes.

Therefore, what is needed is a reliable HVMOS device and method of making using an RPG process.

SUMMARY

In an embodiment, the present disclosure provides an offset gate semiconductor device, which includes a substrate and an isolation feature formed in the substrate. An active region is formed in the substrate substantially adjacent to the isolation feature. An interface layer is formed on the substrate over the isolation feature and the active region. A polysilicon layer is formed on the interface layer over the isolation feature and the active region. A trench being formed in the polysilicon layer over the isolation feature. The trench extending to the interface layer. A fill layer is formed to line the trench and a metal gate formed in the trench.

In another embodiment, the present disclosure provides semiconductor device, which includes a silicon substrate, the substrate having an upper surface. An isolation feature is formed in the substrate, the isolation feature having an upper surface which is lower than the upper surface of the substrate. A source region and a drain region are formed in the substrate. The source region and the drain region form an active region in the substrate, which is substantially adjacent the isolation feature. An interface layer is formed on the substrate over the isolation feature and the active region. A polysilicon layer is formed on the interface layer over isolation feature and the active region. A trench is formed in the polysilicon layer over the isolation feature, the trench extending to the interface layer. A fill layer is formed to line the trench and a metal gate is formed in the trench.

In yet another embodiment, the present disclosure provides a method of fabricating a semiconductor device. The method includes providing a substrate and forming an isolation feature in the substrate. The method also includes forming an active region in the substrate, the active region substantially adjacent the isolation feature. Additionally the method includes forming an interface layer on the substrate over the isolation feature and the active region. The method includes forming a polysilicon layer on the interface layer over isolation feature and the active region. Moreover, the method includes forming a trench in the polysilicon layer over the isolation feature, the trench extending to the interface layer. Next, the method includes forming a fill layer in the trench and forming a metal gate in the trench.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the field of semiconductor integrated circuits. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Certain embodiments described herein are illustrated as a particular type of semiconductor device. However, numerous other embodiments are possible. For example, the disclosure is applicable to complementary HVMOS devices (e.g., a high voltage NMOS transistor as well as a high voltage PMOS transistor). The disclosure is also applicable to various semiconductor devices. For example, power devices including HVMOS devices and various structures thereof (e.g., lateral diffused (LDMOS), extended-drain (EDMOS), vertical double-diffused (VDMOS), double-diffused drain (DDD) MOS devices). The embodiments described herein are exemplary only and not intended to be limiting.

In an embodiment, the present disclosure provides a high voltage metal-oxide-semiconductor (HVMOS) device fabricated using a high k metal gate (HKMG), gate last process. For example, a device may be fabricated using an undoped/lightly doped polysilicon resistor layer in a replacement polysilicon gate (RPG) process to fabricate a novel contact structure that is offset from the active region of the device. Using a polysilicon that is lightly doped drops resistance across the device, therefore increasing gate resistance, which in-turn, creates an HVMOS device able to withstand high voltages across the gate. As should be readily understood, embodiments of devices described herein and others within the broad scope contemplated have an ability to withstand high voltages (e.g., >~5V) without adding significant cost in fabrication to the device. Such devices fabricated using an RPG process provide improved HVMOS performance over conventional devices.

Figure 1:
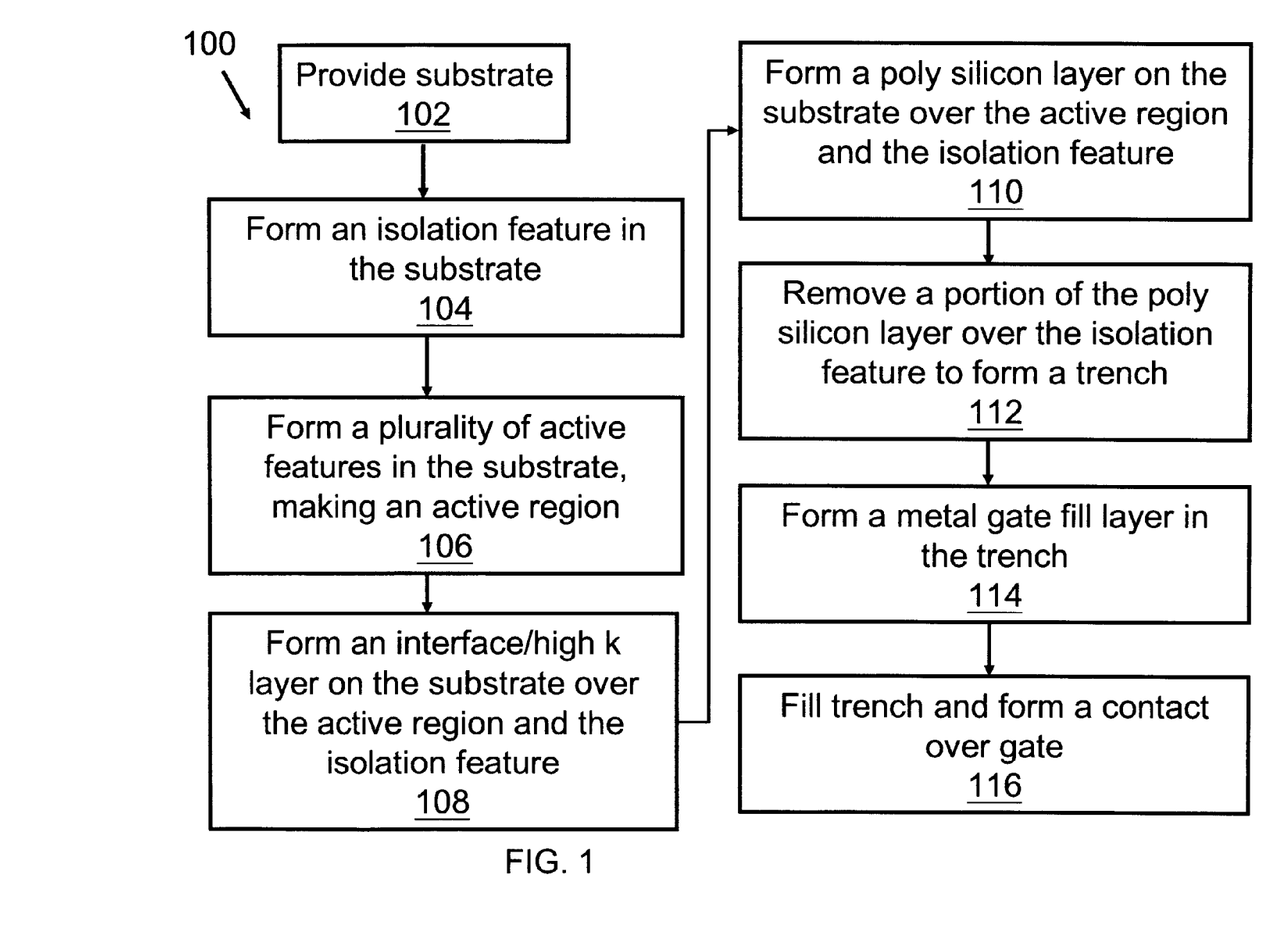
FIG. 1 illustrates a flow chart of an embodiment of a method for fabricating an offset gate semiconductor device according to the present disclosure.
Figure 2:
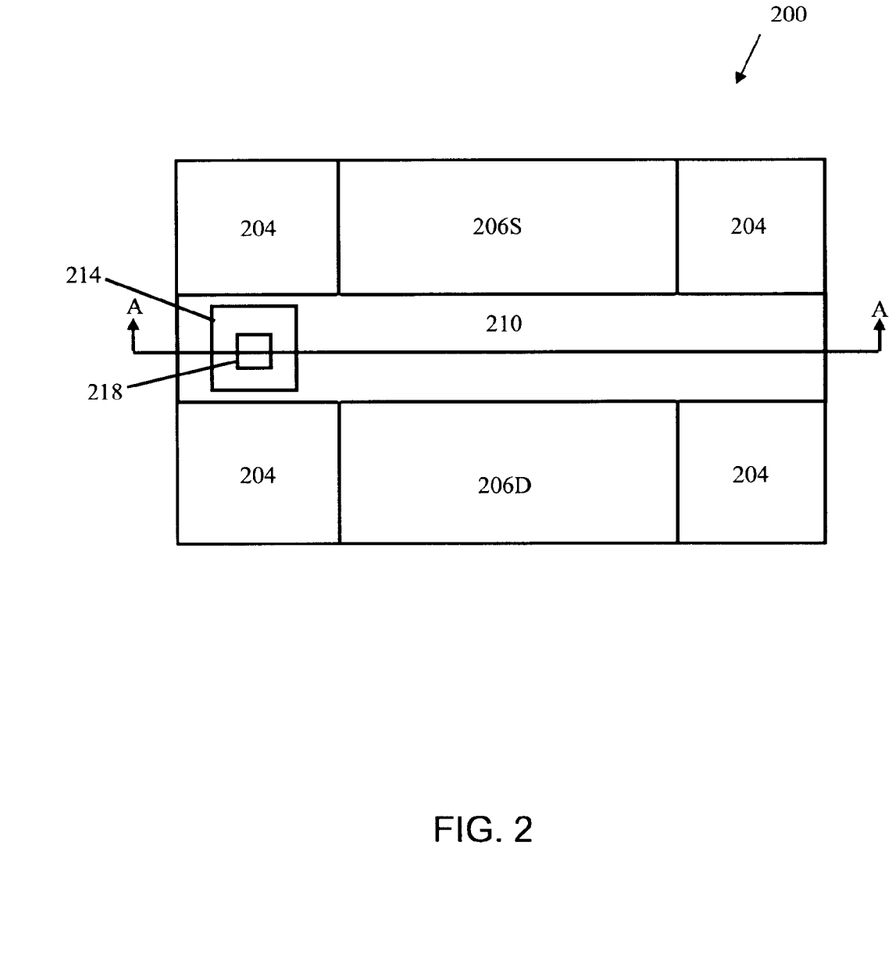
FIG. 2 illustrates a plan/top view of an embodiment of the offset gate semiconductor device fabricated according to the method of FIG. 1.
Figure 3:
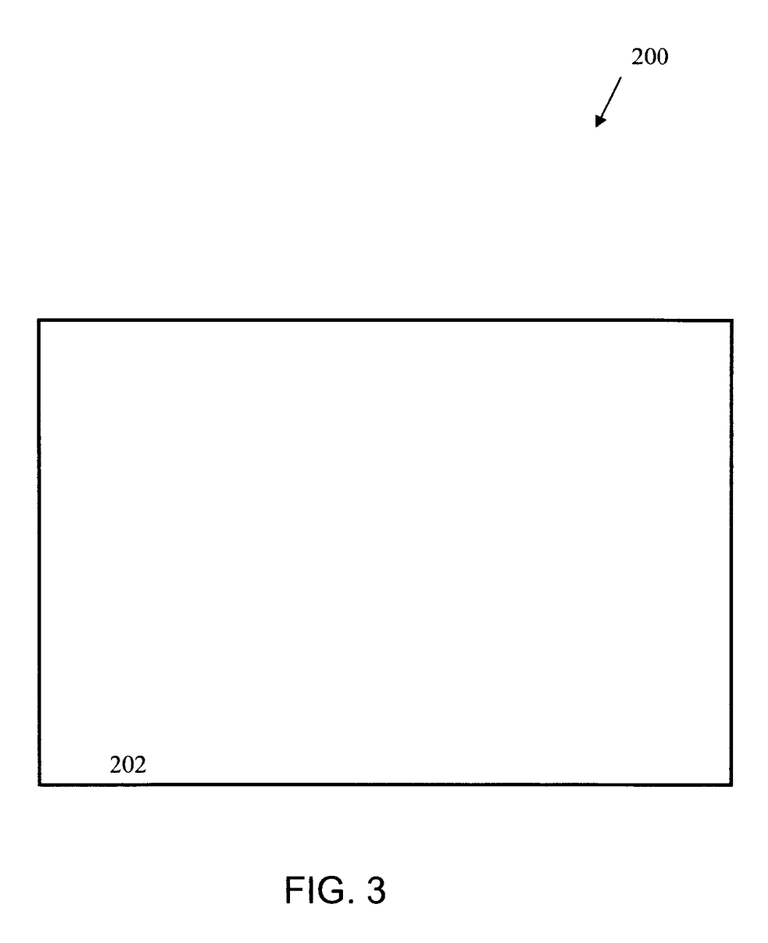
FIGS. 3-10 illustrate cross-sectional side views along lines A-A of the offset gate semiconductor device of FIG. 2 at various stages of fabricating according to the method of FIG. 1.

FIG. 1 illustrates a flow chart of an embodiment of a method 100 for fabricating an semiconductor device, such as an offset gate semiconductor device (e.g., a HVMOS device) (n-type or p-type), or a portion thereof, according to the present disclosure. The method 100 is described with reference to FIGS. 2-10. FIG. 2 illustrates a plan/top view of an embodiment of an offset gate semiconductor device 200 fabricated according to the method 100. FIGS. 3-10 illustrate cross-sectional side views along lines A-A of the offset gate semiconductor device 200 at various stages of fabricating according to the method 100. It should be noted the method 100 may be implemented in a complementary metal oxide semiconductor (CMOS) technology process flow. Accordingly, it is understood that additional processes may be provided before, during, and after the method 100, and some processes may only be briefly described herein.

The method 100 may be used to fabricate the semiconductor device 200, or portion thereof. The method 100 begins at block 102 where a substrate 202 is provided (see FIG. 3). The substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In various embodiments, the substrate 202 may include a buried layer such as an n-type buried layer (NBL) and/or a p-type buried layer (PBL). The substrate 202 may be a p-type substrate or n-type substrate.

Figure 4:
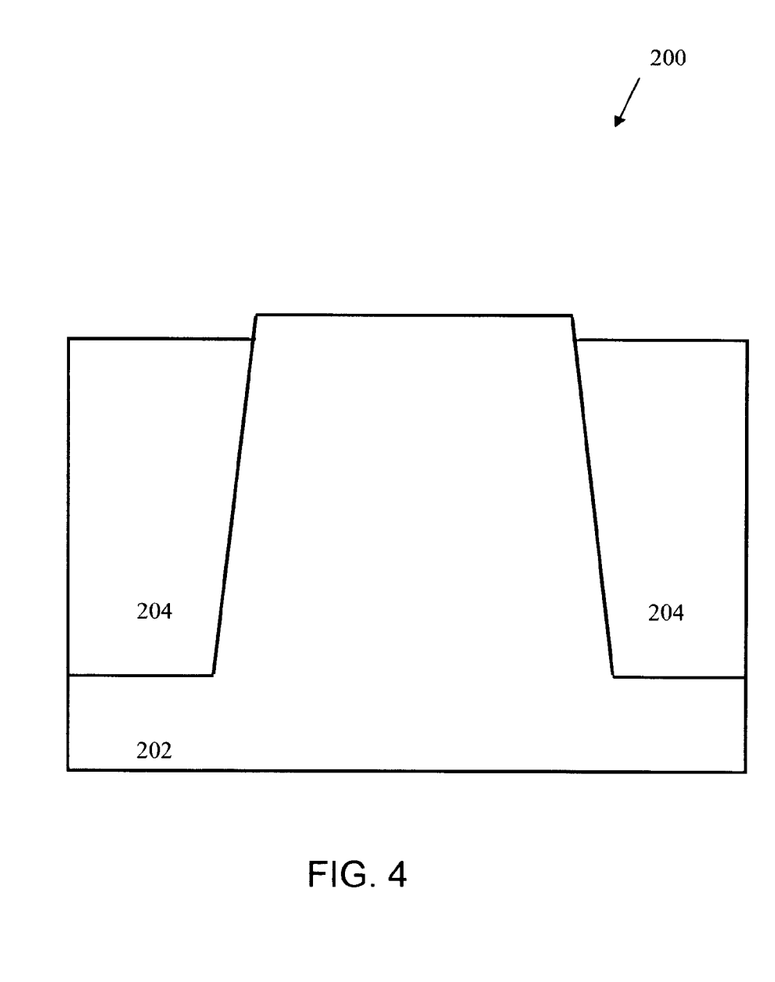
Figure 5:
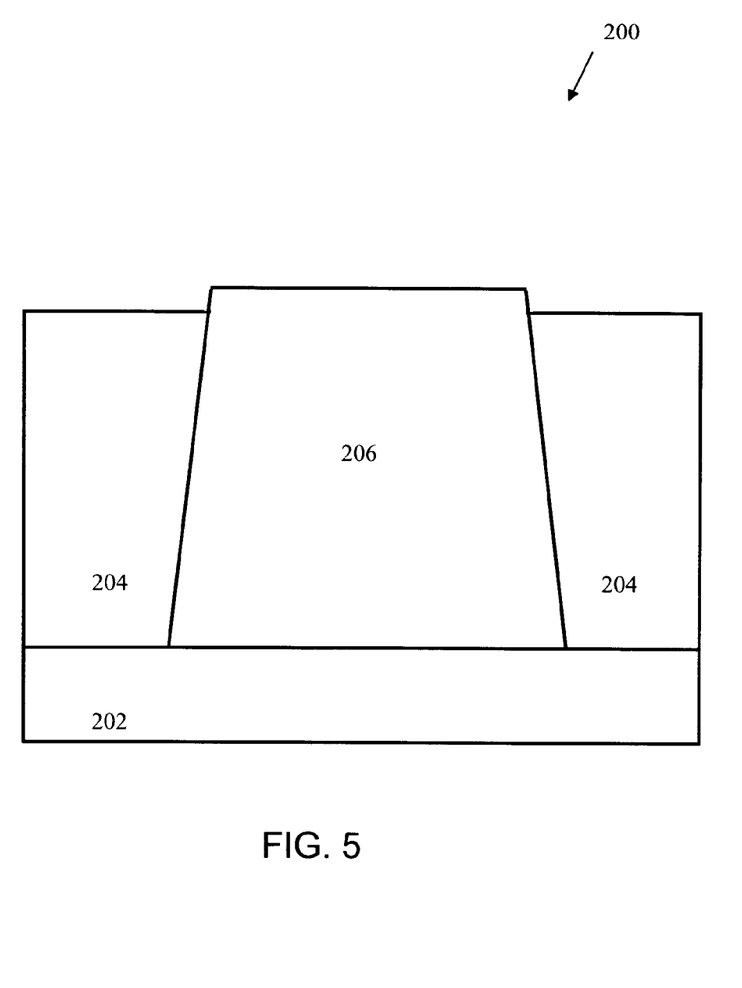

The method 100 proceeds to block 104 where an isolation feature 204, such as a shallow trench isolation (STI) feature is formed in the substrate 202 (See FIGS. 2 and 4). In an embodiment, an isolation feature 204 may be formed in the substrate to define and electrically isolate various active regions. The formation of an STI structure may include dry etching a trench in the substrate 202 and filling the trench with insulator materials such as silicon oxide, silicon nitride, or silicon oxynitride. The filled trench may have a multi-layer structure such as a thermal oxide liner layer filled with silicon nitride or silicon oxide. The STI structure may be created using a processing sequence such as patterning an STI opening using photoresist and masking, etching a trench in the substrate, optionally growing a thermal oxide trench liner to improve the trench interface, filling the trench with CVD oxide, and using chemical mechanical polishing (CMP) processing to etch back and planarize. In an embodiment, the isolation feature 204 may have an upper surface which is lower than the upper surface of the substrate 202 (See FIG. 4).

The method 100 proceeds to block 106 where a plurality of features are formed in the substrate 202, making an active region 206 in the substrate 202. The various features may include doped regions such as a source region (e.g., 206S, FIG. 2) and a drain region (e.g., 206D, FIG. 2). In different embodiments, the various features may also include low-dosed source/drain regions, doped well regions such as p-type or n-type high voltage wells, highly doped and lightly doped wells, field oxide (FOX) regions or local oxidation of silicon (LOCOS), buried layers such as an n-type buried layer (NBL), a p-type buried layer (PBL), interconnections such as multiple layer interconnects (MLI) including metal lines, vias, and contacts, and/or other suitable features. One or more of the features may be implemented using a complementary metal oxide semiconductor (CMOS) technology.

As should be understood, the wells (e.g., source 206S and/or drain 206D) may be formed on the substrate 202. The wells may be of a first type of conductivity or a second type of conductivity (e.g., n-type or p-type doping). The wells may be a portion of the substrate 202, and may be formed by various ion implantation processes. One or more of the wells may be portions of an epitaxy layer such as a silicon epitaxy layer formed by epitaxy processing. An N-well may have an n-type dopant such as phosphorus or arsenic (As), and a P-well may have a p-type dopant such as boron. In one embodiment, the N-well and P-well may be formed by a plurality of processing steps such as growing a sacrificial oxide on substrate, opening a pattern for the location(s) of the well region, and implanting the impurities.

Figure 6:
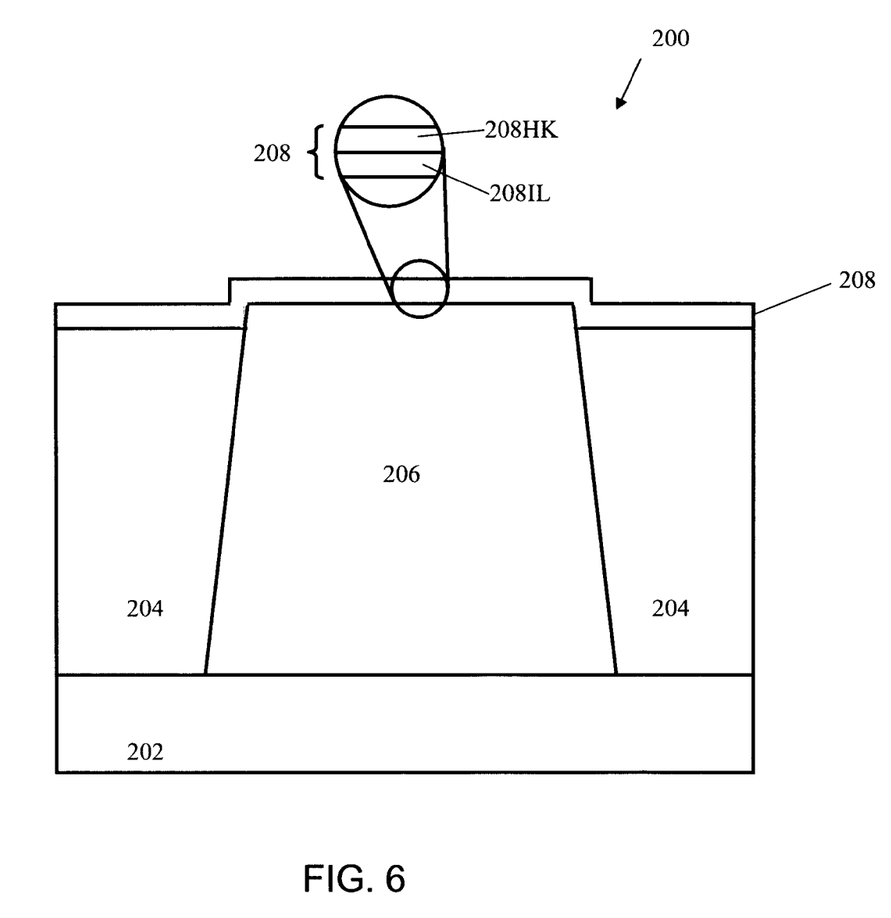

The method 100 proceeds to block 108 where an dielectric/interface layer 208 is formed on the substrate 202 over the active region 206 and the isolation feature 204 (See FIG. 6). The interface layer 208 may include silicon dioxide ($SiO_2$), silicon oxynitride (SiON), and combinations thereof, referred to as silicon oxide (See FIG. 6, 208IL at a thickness range of approximately 5 angstroms to approximately 20 angstroms. Additionally, the interface layer 208 may include a high-k dielectric material, such as $HfO_2$, $ZrO_2$, and/or combinations of Hf/Zr (See FIG. 6, 208HK) at a thickness range of approximately 5 angstroms to approximately 40 angstroms. Thus, the interface layer 208 may have a multilayer structure such as one layer of silicon oxide and another layer of high k material. In other embodiments, the high-k material (e.g., 208HK) may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, or combinations thereof.

The various layers of the interface layer 208 may be formed using chemical vapor deposition (CVD), physical vapor deposition (PVD), atomic layer deposition (ALD), thermal oxide, other suitable processes, and/or combinations thereof. The interface layer 208 may be defined using photolithography, etching, and/or other suitable processes to pattern the layer 208.

Figure 7:
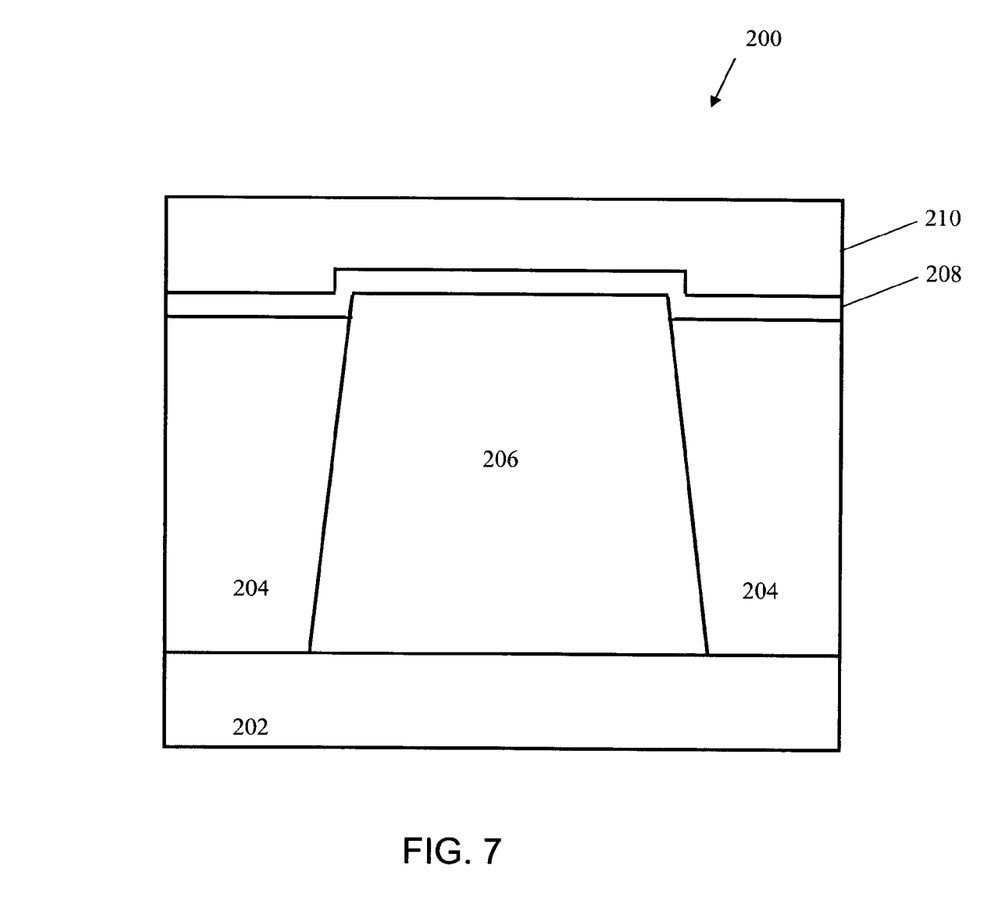
Figure 8:
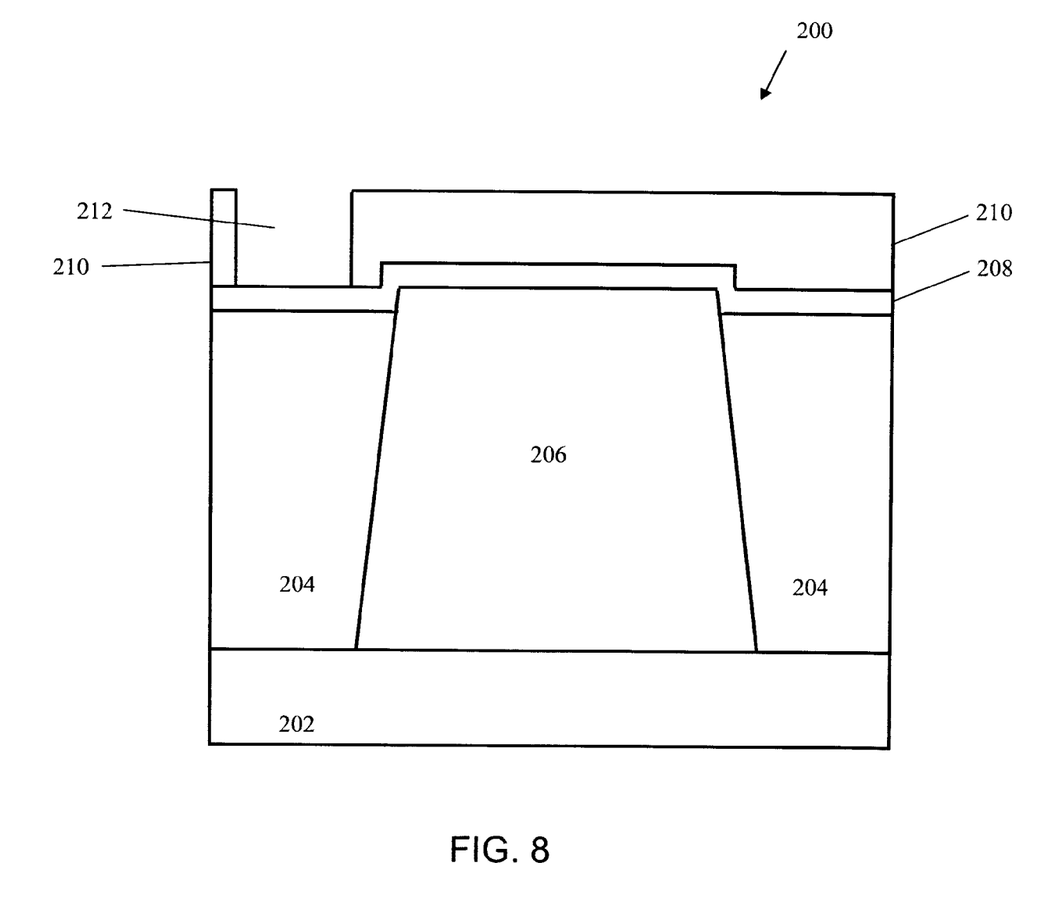

The method 100 proceeds to block 110 where a replacement gate structure/polysilicon layer 210 is formed on the substrate 202 extending over the active region 206 and the isolation feature 204 (See FIGS. 2 and 7). In an embodiment the polysilicon layer 210 includes a doped or non-doped polycrystalline silicon. In an embodiment, the polysilicon layer 210 is formed by a suitable deposition process. For example, silane ($SiH_4$), di-silane ($Si_2H_6$), or di-clorsilane ($SiCl_2H_4$) may be used as a chemical gas in a CVD process to form the polysilicon layer 210. Alternatively, an amorphous silicon layer may optionally be formed instead of the polysilicon layer.

The method 100 proceeds to block 112 where a portion of the polysilicon layer 210 is removed over the isolation feature 204 to form a gate stack trench 212 (See FIGS. 2 and 8) through the polysilicon layer 210 down to the interface layer 208. Thus, a gate structure formed in the trench 212 is electrically coupled to the active region 206. Therefore, as should be understood, a gate stack will be formed in the trench 212 over the isolation feature 204, rather than over the active region 206. In an embodiment, the formation of the trench 212 may be formed using a patterning process. The patterning may be performed by processes such as photolithography, etching, deposition, and/or other suitable processes. The patterning masks a portion of the polysilicon layer 210, while a second portion (e.g., the trench 212) is processed. In an embodiment, the polysilicon layer 210 is patterned by depositing a layer of photoresist by a suitable process such as spin-on coating, and then patterned to form a patterned photoresist masking feature by a proper lithography patterning method. The pattern of the photoresist can then be transferred by an etching process to the underlying dielectric layer, in a plurality of processing steps and various proper sequences. In an embodiment, the process includes the use of a hard mask layer. The photoresist layer may be stripped thereafter.

Figure 9:
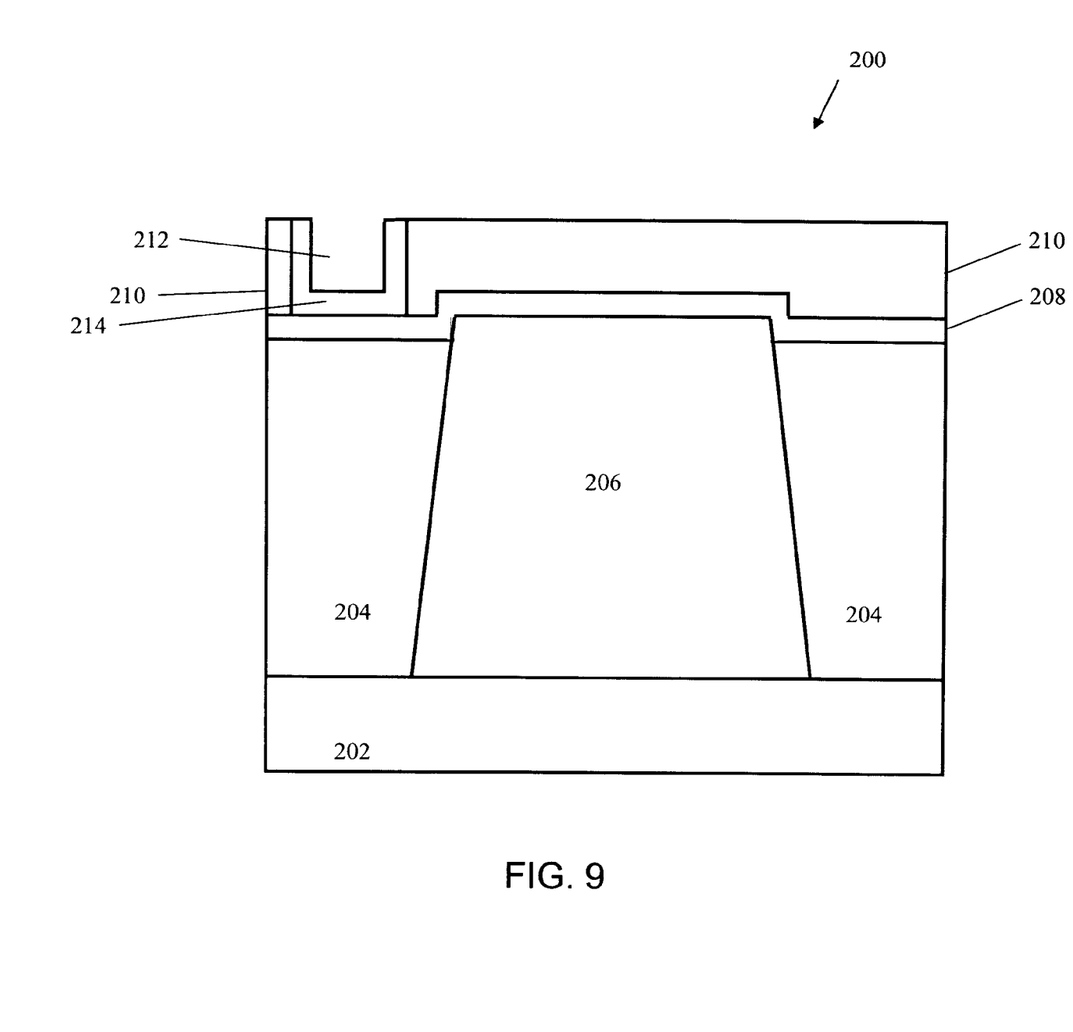

The method then proceeds to block 114 where a metal gate fill layer 214 is formed in the trench 212 (See FIGS. 2 and 9). The fill layer 214 may include a metal such as TaN, TiN, Ti, TiAl, TiAlN, and combinations thereof. In an embodiment, the fill layer 214 comprises TaN formed at a thickness range of approximately 1-5 nanometers. In an alternative embodiment, the fill layer 214 comprises TiN, Ti, TiAl or TiAlN formed at a thickness range of approximately 2-20 nanometers. The fill layer 214 may be formed by chemical vapor deposition (CVD), physical vapor deposition (PVD), atomic layer deposition (ALD), plating, and/or other proper processes. Photolithography and/or etching steps may also be used to pattern the fill layer 214.

Figure 10:
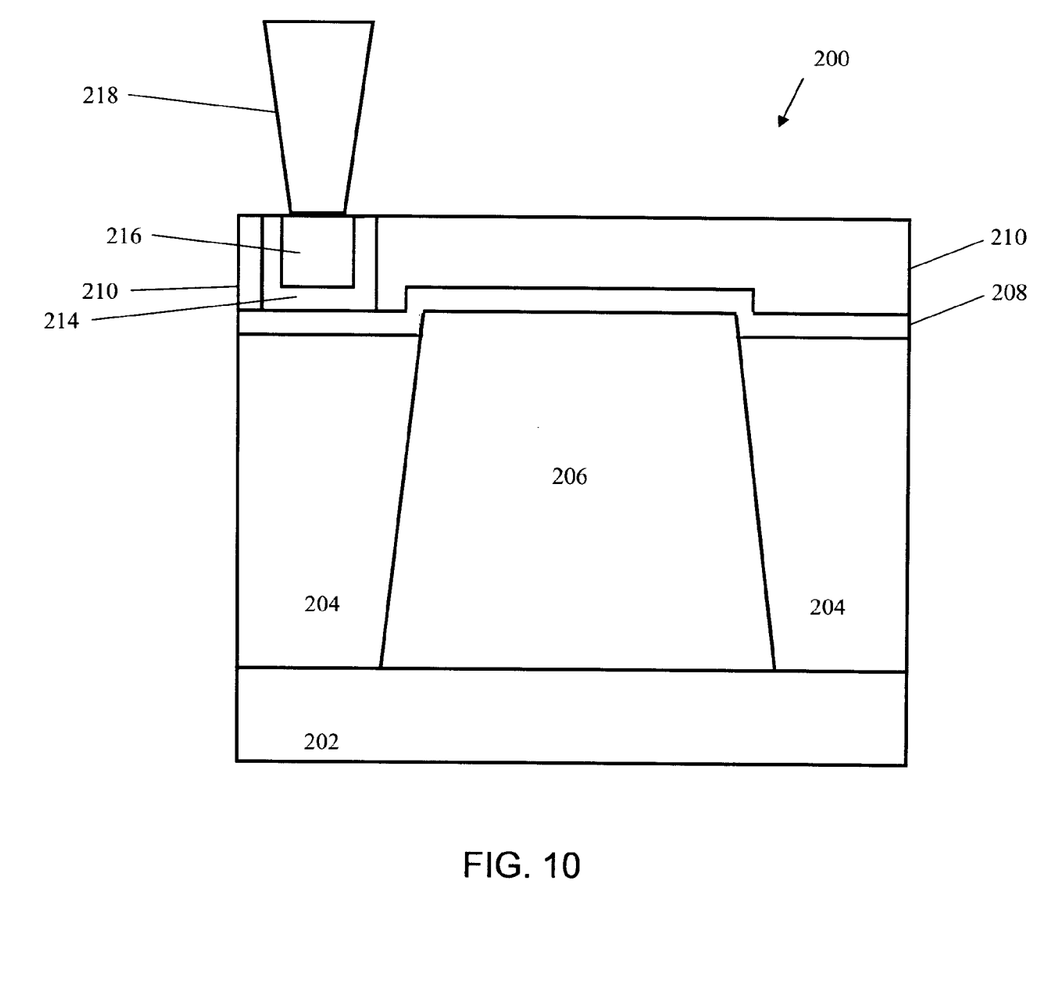

The method 100 then proceeds to block 116 where the trench 212 is filled with a gate electrode 216, and a contact 218 is formed over the gate electrode 216 (See FIGS. 2 and 10). As should be understood, the gate stack includes a gate dielectric interface/high k layer 208, a fill layer 214 and a gate electrode 216 formed in the trench 212. The gate electrode 216 is configured to be coupled the metal interconnects (e.g., MLI) contact 218. The gate electrode 216 comprises aluminum. However, in other embodiments, the gate electrode may include a metal such as Cu, W, Ti, Ta, TiN, TaN, NiSi, CoSi, other suitable conductive materials, or combinations thereof. The gate electrode 216 may be formed by chemical vapor deposition (CVD), physical vapor deposition (PVD), atomic layer deposition (ALD), plating, and/or other proper processes. Photolithography and/or etching steps may also be used to pattern the gate electrode 216. The gate electrode 216 may have a multilayer structure formed at a location offset from the active region 206, such as over the isolation feature 204 and may be formed in a multiple-step process.

The foregoing has outlined features of several embodiments. The disclosed structure and method may have various embodiments, modifications and variations. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An offset gate semiconductor device comprising:
    a substrate,
    an isolation feature formed in the substrate;
    an active region formed in the substrate substantially adjacent the isolation feature;
    an interface layer formed on the substrate over the isolation feature and the active region;
    a polysilicon layer formed on the interface layer over the isolation feature and the active region;
    a trench formed in the polysilicon layer over the isolation feature, the trench extending to the interface layer;
    a fill layer formed to line the trench, but not fill the trench; and
    a metal gate formed in the trench.

2. The semiconductor device of claim 1, further comprising:
    a contact formed on the metal gate.

3. The semiconductor device of claim 1, wherein the isolation feature is a shallow trench isolation (STI) feature.

4. The semiconductor device of claim 1, wherein the interface layer includes a silicon oxide layer and a high k material layer.

5. The semiconductor device of claim 4, wherein the silicon oxide layer comprises SiO2, SiON, and combinations thereof at a thickness range of approximately 5 angstroms to approximately 20 angstroms.

6. The semiconductor device of claim 4, wherein the high k material layer comprises HfO2, ZrO2, and combinations thereof at a thickness range of approximately 5 angstroms to approximately 40 angstroms.

7. The semiconductor device of claim 1, wherein the fill layer comprises TaN at a thickness range of approximately 1 nanometer to approximately 5 nanometers, TiN at a thickness range of approximately 2 nanometer to approximately 20 nanometers, Ti at a thickness range of approximately 2 nanometer to approximately 20 nanometers, TiAl at a thickness range of approximately 2 nanometer to approximately 20 nanometers, or TiAlN at a thickness range of approximately 2 nanometer to approximately 20 nanometers.

8. A semiconductor device comprising:
    a silicon substrate, the substrate having an upper surface,
    an isolation feature formed in the substrate, the isolation feature having an upper surface which is lower than the upper surface of the substrate;
    a source region and a drain region formed in the substrate, the source region and the drain region thereby form an active region in the substrate, the active region substantially adjacent the isolation feature;
    an interface layer formed on the substrate over the isolation feature and the active region;
    a polysilicon layer formed on the interface layer over isolation feature and the active region;
    a trench formed in the polysilicon layer over the isolation feature, the trench extending to the interface layer;
    a fill layer formed to line the trench, but not fill the trench; and
    a metal gate formed in the trench.

9. The semiconductor device of claim 8, wherein the isolation feature is a shallow trench isolation (STI) feature.

10. The semiconductor device of claim 8, wherein the isolation feature is a shallow trench isolation (STI) feature.

11. The semiconductor device of claim 8, wherein the interface layer includes a silicon oxide layer and a high k material layer.

12. The semiconductor device of claim 11, wherein the silicon oxide layer comprises SiO2, SiON, and combinations thereof at a thickness range of approximately 5 angstroms to approximately 20 angstroms.

13. The semiconductor device of claim 11, wherein the high k material layer comprises HfO2, ZrO2, and combinations thereof at a thickness range of approximately 5 angstroms to approximately 40 angstroms.

14. The semiconductor device of claim 8, wherein the fill layer comprises TaN at a thickness range of approximately 1 nanometer to approximately 5 nanometers, TiN at a thickness range of approximately 2 nanometer to approximately 20 nanometers, Ti at a thickness range of approximately 2 nanometer to approximately 20 nanometers, TiAl at a thickness range of approximately 2 nanometer to approximately 20 nanometers, or TiAlN at a thickness range of approximately 2 nanometer to approximately 20 nanometers.

15. A method of fabricating a semiconductor device, the method comprising:
   providing a substrate,
   forming an isolation feature in the substrate;
   forming an active region in the substrate, the active region substantially adjacent the isolation feature;
   forming an interface layer on the substrate over the isolation feature and the active region;
   forming a polysilicon layer on the interface layer over isolation feature and the active region;
   forming a trench in the polysilicon layer over the isolation feature, the trench extending to the interface layer;
   forming a fill layer in the trench; and
   forming a metal gate in the trench.

16. The method of claim 15, thereby forming the isolation feature as a shallow trench isolation (STI) feature.

17. The method of claim 15, thereby forming the interface layer to include a silicon oxide layer and a high k material layer.

18. The method of claim 17, wherein the silicon oxide layer comprises SiO2, SiON, and combinations thereof at a thickness range of approximately 5 angstroms to approximately 20 angstroms.

19. The method of claim 17, wherein the high k material layer comprises HfO2, ZrO2, and combinations thereof at a thickness range of approximately 5 angstroms to approximately 40 angstroms.

20. The method of claim 15, wherein the fill layer comprises TaN at a thickness range of approximately 1 nanometer to approximately 5 nanometers, TiN at a thickness range of approximately 2 nanometer to approximately 20 nanometers, Ti at a thickness range of approximately 2 nanometer to approximately 20 nanometers, TiAl at a thickness range of approximately 2 nanometer to approximately 20 nanometers, or TiAlN at a thickness range of approximately 2 nanometer to approximately 20 nanometers.

* * * * *